(12) United States Patent
McEwan

(10) Patent No.: US 8,115,673 B1
(45) Date of Patent: Feb. 14, 2012

(54) SELF-OSCILLATING UWB EMITTER-DETECTOR

(75) Inventor: Thomas Edward McEwan, Las Vegas, NV (US)

(73) Assignee: McEwan Technologies, LLC, Las Vegas, NV (US)

( * ) Notice: Subject to any disclaimer, the term of this patent is extended or adjusted under 35 U.S.C. 154(b) by 1221 days.

(21) Appl. No.: 11/891,364

(22) Filed: Aug. 11, 2007

(51) Int. Cl.
*G01S 13/00* (2006.01)

(52) U.S. Cl. ............ 342/175; 342/89; 342/110; 342/197

(58) Field of Classification Search ................... 342/175
See application file for complete search history.

(56) References Cited

U.S. PATENT DOCUMENTS

| | | | |
|---|---|---|---|
| 4,219,779 A | | 8/1980 | Shinkawa et al. |
| 5,280,290 A | * | 1/1994 | Evans .......................... 342/128 |
| 5,361,070 A | * | 11/1994 | McEwan ........................ 342/21 |
| 5,465,418 A | * | 11/1995 | Zhou et al. .................... 455/332 |
| 5,517,198 A | * | 5/1996 | McEwan ........................ 342/89 |
| 5,523,760 A | * | 6/1996 | McEwan ........................ 342/89 |
| 5,630,216 A | | 5/1997 | McEwan |
| 6,594,478 B1 | * | 7/2003 | Nair et al. ..................... 455/333 |
| 6,778,132 B2 | * | 8/2004 | Palata .......................... 342/175 |
| 6,944,565 B2 | * | 9/2005 | Mcneilage et al. ............ 702/106 |
| 7,310,061 B2 | * | 12/2007 | Nagasaku et al. ............ 342/104 |
| 7,574,219 B2 | * | 8/2009 | Rofheart et al. ........... 455/456.1 |
| 7,580,380 B2 | * | 8/2009 | Baker et al. .................... 370/310 |
| 2005/0175125 A1 | * | 8/2005 | Krivokapic ................... 375/340 |

OTHER PUBLICATIONS

Lazarus et al. "Ultra-wideband millimetre-wave self-oscillating mixer". IEE Proceedings, Part H—Microwaves, Optics and Antennas. vol. 130, pt. H, No. 5, Aug. 1983, p. 340-342.*
Winkler et al, "Integrated Receiver Based on High-Order Subharmonic Self Oscillating Mixer," IEEE Trans. on Microwave Theory and Techniques, Jun. 2007, pp. 1298-1404, vol. 55, No. 6, USA.
Moncunill-Geniz et al, "An 11-Mb/s 2.1mW Synchronous Superregenerative Receiver at 2.4GHz," IEEE Trans. on Microwave Theory and Techniques, Jun. 2007, pp. 1355-1362 vol. 55, No. 6, USA.

* cited by examiner

*Primary Examiner* — Thomas Tarcza
*Assistant Examiner* — Matthew M Barker

(57) ABSTRACT

A UWB RF detector employs a pulsed self-oscillating mixer (SOM) and an output integrator to provide low-noise preamplification, mixing and sampling. The SOM produces short-burst, microwave self-oscillations that are phase-locked to a clock. The self-oscillations are used for mixing. The SOM can also radiate UWB RF pulses. A one-transistor SOM can simultaneously implement both a UWB emitter and a UWB detector in a radar transceiver. A control loop can stabilize the self-oscillations at nanowatt levels. Nanowatt UWB radars and radios can be realized, thereby opening new spectral bands beyond those formally designated for UWB operation.

9 Claims, 5 Drawing Sheets

SELF-OSCILLATING UWB EMITTER-DETECTOR

BACKGROUND OF THE INVENTION

1. Field of the Invention

The present invention relates to radar detection circuits and more particularly to ultra-wideband (UWB) RF pulse detection circuits. The invention can be used to detect pulses for UWB radar rangefinders, motion sensors, time domain reflectometers (TDR), pulsed laser sensors, radiolocation systems, and communication systems.

2. Description of Related Art

In 1918, Edwin H. Armstrong invented the superheterodyne radio which translated a high incoming radio frequency (RF) to an intermediate frequency (IF) using a local oscillator and a mixer. Shortly thereafter, the mixer and oscillator were combined into a single function using a single vacuum tube which functioned as both a local oscillator and a mixer. A device that functions as both an oscillator and a mixer can be termed a self-oscillating mixer (SOM). The oscillations in early radio SOMs were continuous wave (CW) and were not phase coherent with the incoming RF, i.e., there were no RF cycles and oscillation cycles that repeatedly aligned on each cycle or on every $N^{th}$ cycle, where N is an integer. Later versions of the SOM employed transistors. The SOMs in superheterodyne receivers produce an IF output that is amplified and then detected—the detection function is not part of the SOM.

The superregenerative receiver, patented in 1922 by Armstrong, employs a pulsed SOM that serves as a pulsed oscillator and pulsed mixer. The SOM is pulsed repeatedly by drive, or quench, pulses at a moderate rate, typically just above the audio frequency band. Very small levels of incoming RF influence the start-up phase and duration of the pulsed oscillations in the SOM, which in turn varies, on an amplified scale, the average DC current through the SOM. The output of the SOM is coupled to a lowpass filter (LPF), which acts as an integrator that integrates multiple pulses from the SOM to produce a detected output signal. The oscillations in the SOM are not phase coherent with the drive pulses; rather, the oscillations are of random phase when no incoming RF is present and are phase-locked to the incoming RF when the RF is strong. Due to phase-locking, a beat frequency cannot be produced; rather a phase-less current pulse is produced by the pulsed SOM, i.e., the response is a magnitude response with no phase information. Superregenerative receivers are commonly used in receivers for garage-door and automobile doors. An example of a Micropower superregenerative receiver is disclosed in U.S. Pat. No. 5,630,216, "Micropower RF Transponder with Superregenerative Receiver and RF Receiver with Sampling Mixer," by the present inventor, Thomas E. McEwan. A recent example of a microwave superregenerative receiver is given by Moncunill-Geniz et al in an IEEE paper entitled "An 11-Mb/s 2.1 mW Synchronous Superregenerative Receiver at 2.4 GHz." This paper discloses a method of taking one sample per data bit of received RF as opposed to taking several samples or more per bit in the classical superregenerative receiver. As in prior super-regenerative receivers, the oscillations are allowed to build up slowly to maximize their possibility of becoming phase-locked to the incoming RF and not to the pulse driver.

A very recent example of a SOM is disclosed by Winkler et al in an IEEE paper entitled "Integrated Receiver Based on a High-Order Subharmonic Self-Oscillating Mixer." CW operation is employed with the RF input being at a harmonic of the oscillation frequency. One aspect of the SOM disclosed is an arrangement to cancel local oscillator leakage out the RF input port using two SOMs and a 180° combiner.

Another relevant technology is the ultra-wideband (UWB) sampler. Early examples of UWB samplers can be found in sampling oscilloscopes, such as the Tektronix model S-2 sampling head, dating to the 1960's. The S-2 bandwidth extended from DC to 6 GHz. It operated by short-term integrating an incoming signal during its sampling aperture, and then capturing the integrated sample for longer storage with a sample-hold (S/H) circuit. A long term integrator could be selected to smooth the samples and lower displayed noise. A UWB impulse radar system based on such a sampler was published by Bennett and Ross in 1978. Since each impulse is individually sampled and held, individual, pulse-by pulse receiver processing is employed.

In 1993, two patents disclosed a new type of impulse radar based on integrated-pulse receiver processing. These were U.S. Pat. No. 5,345,471, "Ultra-WideBand receiver" and U.S. Pat. No. 5,361,070 "Ultra-Wideband Radar Motion Sensor," both by the present inventor. The '471 receiver samples multiple pulse repetitions and coherently integrates them in one step, using a gated integration capacitor connected directly to the antenna. The integrated output from the capacitor is a non-pulsed, continuous, detected output signal that is easy to process using simple low-bandwidth circuitry. This new technology is dubbed Micropower Impulse Radar (MIR) and is in wide commercial use through patent licensing.

One potential limitation to impulse type samplers is their bandwidth can be too large for some applications, e.g., their bandwidth extends to zero, even though antennas cannot transmit and receive zero Hertz or relatively low frequencies (relative to their size). This excessive bandwidth can, for example, substantially degrade S/N when operating in the 24-31 GHz UWB band while using a sampler that spans from DC to 31 GHz. It is clearly preferable to use a matched bandwidth sampler. For example, UWB radars can be made to operate in the 5.4-7.1 GHz region under FCC Part 15.209 regulations, which cover general emission limits. This band is not formally allocated for UWB operation, but UWB operation is permitted provided the emission level is extremely low (about one nanowatt average transmit level). The most efficient receiver for this application—where every decibel counts with nanowatt transmitters—is one with a bandwidth matched to the transmitter bandwidth, and not the classic UWB impulse sampler. Prior approaches to matched bandwidth employ conventional filters and mixers, which are inefficient, bulky, costly, and require power-hungry preamplifiers. Presently, there is no approach that provides a compact, low cost, low power, matched bandwidth, sampling solution.

SUMMARY OF THE INVENTION

The invention is a UWB RF pulse detector, comprising: a self-oscillating mixer (SOM) having an input port for coupling UWB RF signals to the SOM; a drive pulse port for coupling drive pulses to the SOM, wherein the drive pulses produce phase-locked oscillations in the SOM; a mixer output line for outputting mixer pulses from the SOM, wherein the mixer pulses result from mixing action between the UWB RF input signals and the self-oscillations; and, an integrator coupled to the mixer output line for coherently integrating two or more mixer output pulses and for producing a detected output signal.

In detail, it is a UWB RF pulse detector, comprising: a transistor having a collector, a base and an emitter for simultaneously providing an oscillation element and a mixer element; a microwave oscillator circuit including the transistor, an RF input line coupled to the base for coupling UWB RF input signals to the transistor, a drive pulse line coupled to the emitter for coupling drive pulses to the transistor for driving the transistor into microwave oscillations that are phase-locked to the drive pulses; an integrating capacitor coupled to the collector for coherently integrating mixer pulses from the transistor and for producing a detected output signal.

In a homodyne emitter-detector configuration, it is a self-oscillating emitter-detector radar system comprising: a timing system for producing a transmit and a receive dock signal; a SOM responsive to both dock signals and for producing RF oscillations that are phase-locked to each clock signal; an antenna coupled to the SOM for transmitting RF pulses produced by the SOM and for receiving UWB RF echoes and for providing UWB RF echo pulses to the SOM; and, an integrator coupled to the SOM for coherently integrating mixer pulses from the SOM and for producing a detected output signal. The self-oscillating emitter-detector radar system can provide an adjustable or a fixed delay between the transmit and receive clock signals for producing range-gated Doppler signals from the integrator. The self-oscillating emitter-detector radar system can also provide a swept delay between the transmit and receive clock signals for producing video pulse signals from the integrator.

In a heterodyne emitter-detector configuration, it is a self-oscillating emitter-detector radar system, comprising: a timing system for producing a transmit and a receive dock signal; a transmit SOM responsive to the transmit dock signal for producing RF oscillations that are phase-locked to the transmit clock signal; an antenna coupled to the first SOM for transmitting the RF self-oscillations; a receive SOM responsive to the receive clock signal for producing mixer RF oscillations that are phase-locked to the receive clock signal; an antenna coupled to the second SOM for receiving UWB RF echoes and for providing UWB RF echo pulses to the receive SOM; and, an integrator coupled to the second SOM for coherently integrating mixer pulses from the second SOM and for producing a detected output signal. The self-oscillating emitter-detector radar system can provide an adjustable or a fixed delay between the transmit and receive clock signals for producing range-gated Doppler signals from the integrator. The self-oscillating emitter-detector radar system can also provide a swept delay between the transmit and receive clock signals for producing video pulse signals from the integrator.

Objects of the present invention are: (1) to provide a sensitive, simple, and low-cost, RF pulse detection system for UWB pulsed radar, TDR and laser ranging systems; (2) to provide a matched bandwidth UWB RF detector, (3) to provide a UWB RF detector that simultaneously incorporates low noise preamplification; (4) to provide a regulated, very low power level RF oscillator for low power transmitters and detectors; and (5), to provide a mixer with very low levels of local oscillator leakage.

DETAILED DESCRIPTION OF THE INVENTION

Figure 1:
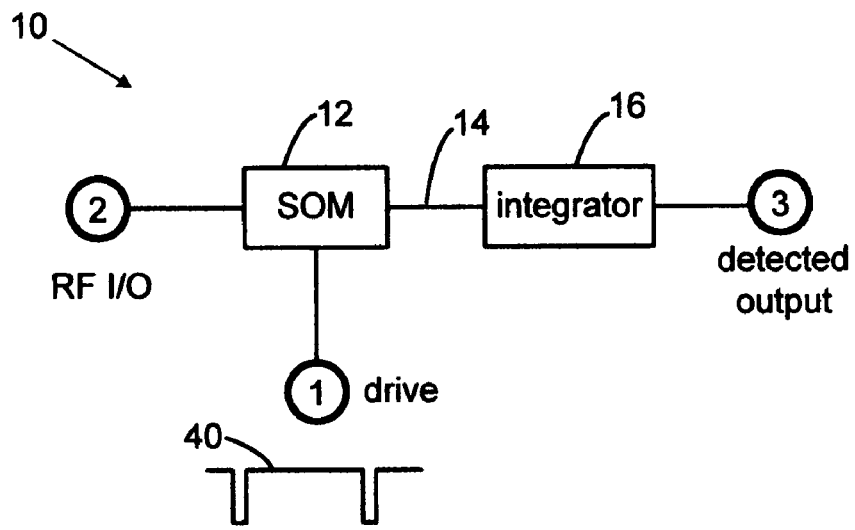
FIG. 1 is a block diagram of a self-oscillating emitter-detector of the present invention.

A detailed description of the present invention is provided below with reference to the figures. White illustrative component values and circuit parameters are given, other embodiments can be constructed with other component values and circuit parameters.

General Description

The present invention overcomes the limitations of the various prior UWB sampling receivers by employing a self-oscillating mixer (SOM) as a matched bandwidth coherent UWB pulse sampler, and by coupling the SOM to an integrator to produce a detected output. The acronym "UWB" is shorthand notation and refers to both a historical definition of ultra-wideband: any signal having a bandwidth of greater than 1 MHz; and to a modern definition of UWB: a signal bandwidth of greater than 25% of its center frequency. Although the claimed apparatus can operate with multi-GHz UWB RF signals, it can also operate with narrowband signals of less than 1 MHz.

The self-oscillating UWB emitter-detector operates by mixing incoming RF signals in a SOM and integrating the SOM output to provide a detected output signal. Drive pulses force the SOM into pulsed RF oscillation, wherein the phase of the RF oscillations is constant, or phase coherent, with respect to the drive pulses, which are derived from a timing edge of a dock waveform. The bandwidth of the pulsed oscillations defines the detection bandwidth, e.g., a 1-ns wide oscillation corresponds to about 1 GHz bandwidth. The phase of the incoming RF signal can either add or subtract from the self oscillations, and thus affect the current in the SOM. The SOM output comprises brief current pulses that are coupled to an integrator. SOM drive pulses are generally comprised of differentiated dock pulses that are active on one polarity, which produce, after integration, an average current through the SOM. This average current can include signal modulation from incoming UWB RF. Signal modulation can be strong when the incoming RF phase is constant or slowly varying with respect to the self-oscillations. When the incoming RF phase is random or the RF frequency is outside the band set by the self-oscillation bandwidth, there is little or no modulation in the integrated output, although there can be random variations in the SOM current pulses prior to integration. Unlike prior art SOM devices, the present invention works with RF input frequencies and phases that are non-random relative to the dock pulses. For example, radar echoes are delayed but of the same frequency, or within a relatively small Doppler offset, of the transmit frequency. In contrast, superregenerative receivers operate with no specific frequency or phase correlation between the RF input and the pulse, or quench, frequency.

The integrator accumulates the current pulses, which have a steady component and a modulated component; the modulated component is due to mixing action between the incoming RF and the self oscillations. The integrator is sign sensitive such that a sequence of negative pulses (relative to the average pulse amplitude) and a sequence of positive pulses can cancel, whereas if all the pulses in a sequence are of the same sign, they will reinforce and integrate to a stronger signal. Consequently, RF signals that have a consistent phase, or slowly varying phase relative to the self oscillations, will coherently add to a stronger signal from the integrator, while random noise and RF interference will tend to average to zero. The detected output signal from the integrator represents the integration of two, and possibly as many as 10,000 or more, drive pulse repetitions. Exemplary parameters are an RF pulse width of 1.5 ns at a center frequency of 6.3 GHz, a drive pulse and SOM oscillation pulse width of 1.5 ns, a pulse repetition frequency of 2 MHz, and an integrated detected output signal bandwidth of 2 kHz.

The self-oscillating UWB emitter-detector can be used in pulse-echo radar systems. One aspect of the invention is it can be used as a transmitter as well as a receiver. The SOM produces leakage oscillations that exit from its RF input port. This leakage signal can be useful for transmitting purposes. Accordingly, a single transistor SOM can perform double duty; first to transmit an RF pulse and second, to receive and detect echoes of that pulse from distant targets, such as oil levels in a large tank. Thus, the self-oscillating emitter-detector can form a simple, low-cost radar using a single RF transistor with very substantial sensitivity and very high bandwidth.

The self-oscillations can be stabilized using a feedback regulator that monitors the average current through the SOM. This feature allows for very fine control of the RF oscillation level, particularly at extremely low oscillation levels, such as 1-nanowatt average RF power level. This low power level is vital for complying with stringent FCC regulations for pulsed operation in broad spectral expanses that are normally not useable for free-space UWB radar and other UWB applications.

In some applications, RF leakage from the SOM is undesirable. Accordingly, two configurations are disclosed that are configured to cancel SOM RF leakage. A first cancellation circuit uses two SOMs that are triggered into oscillation with a staggered delay corresponding to 180° phase difference of RF. When the SOM input ports are tied together, the out-of-phase leakages cancel. A second cancellation circuit triggers two SOM oscillators in phase and employs a 180° splitter/combiner at their RF inputs to effect leakage cancellation.

Specific Description

Turning now to the drawings, FIG. 1 is a block diagram of a self-oscillating UWB emitter-detector, generally 10. A self-oscillating mixer (SOM) 12 has a drive port, labeled port 1, an RF input port labeled port 2 and a SOM output line 14. Line 14 is connected to integrator 16. The integrator produces a detected output signal at port 3. Drive pulses depicted by waveform 40 are applied to the drive port and bias-on the SOM, causing it to oscillate at microwave frequencies for the duration of the of the drive pulse, e.g., during the negative portion of drive waveform 40. Drive waveform 40 is derived from a clock signal. The microwave oscillations in the SOM are coherent to the drive pulses, i.e., they are in a constant phase relation, i.e., phase-locked, with each drive pulse and thus to the clock signal. Generally, this requires a very fast drive pulse that biases-on the SOM on a time scale on the order of one or several microwave oscillation cycles. Drive pulses can be on the order of 1.5 ns wide, which in turn produce about 9 microwave RF cycles at a center frequency of 6.3 GHz, for example.

Drive pulses 40 are derived from a clock signal or a pulse repetition frequency (PRF) oscillator. The drive pulses are often the result of differentiating one edge of a dock square-wave, where the clock could be a transmit or a receive timing clock with a fixed or adjustable delay, or a swept delay between them. The negative drive pulses seen in exemplary waveform 40 rapidly bias-on the SOM and cause the oscillation start-up to be fixed, or phase-locked, relative to the drive pulses. Phase locking is the result of one or two mechanisms: (1) the spectral content of the drive pulse extends into the microwave region (often the case) and injection locks the microwave oscillations at start-up, or (2) the drive pulse switches-on the SOM so rapidly, and the oscillator loop gain is so high, that oscillations build quickly and consistently immediately after application of the drive pulse, e.g., in less than 1-ns. Whatever the mechanism for fast oscillator start-up, the result is the same: the microwave oscillations are phase-locked to the drive pulses. This is in stark contrast to prior art pulsed SOMs where there is no phase constancy between the drive pulse and the oscillations; in particular, phase locking to the drive, or quench, pulse is undesirable. A superregenerative circuit operates best when the drive pulse is slow and gentle to maximize oscillator phase randomness when no signal is present and to maximize oscillator phase that locks onto an incoming RF when the incoming RF is at the lowest possible level. In contrast, the present invention does not lock onto the phase of the incoming RF signal—if it did there could be no Doppler or video pulse detection, both of which rely on a mixer-produced beat frequency between the incoming RF and the self-oscillations.

In the present invention, phase-locking to the drive pulses in combination with a low noise clock or PRF oscillator is essential to most radar applications. For example, in Doppler motion sensors, the Doppler signal can often be less than 1 Hz offset from a 6 or 24 GHz center frequency, and Doppler detection cannot occur without robust phase locking of the transmit RF burst to the receive, or local oscillator burst. Temporal jitter between the drive pulses and the microwave sinusoids must often be on the order of 10 ps or less.

Incoming UWB RF pulses, e.g., 6.3 GHz pulses of 1.5 ns in duration, can be applied to port 1 and thus input to the SOM. If the incoming pulses are applied while the SOM is biased-off, during the positive portion of waveform 40, no mixing action occurs. When the incoming RF pulses coincide with oscillations in the SOM, while the SOM is biased-on, mixing occurs between the UWB RF input and the self-oscillations, and a mixer output pulse is produced on mixer output line 14. This action is a form of gating, or sampling, in the SOM. In combination with the integrator, multiple-pulse coherent UWB sampling is realized. That is, multiple drive pulses and coincident RF input pulses are mixed and coherently accumulated in the integrator to produce an integrated, detected output that can represent the integration of as few as two pulses to more than 10,000 pulses, depending on the integration time constant and the PRF.

The integrator coherently integrates pulses from the SOM, i.e., each pulse is summed algebraically such that pulses having the same sign add constructively while pulses having differing signs can sum to zero. Thus, noise tends to cancel while repetitive pulses can add constructively into a strong, low-noise detected output signal. The signal-to-noise (S/N) ratio increases and RF interference rejection improves as more pulses are integrated.

The detected output signal can be a Doppler signal resulting from target motion with fixed or adjustable transmit-to-receive pulse timing. The detected output signal can also be a radar video signal resulting from sweeping receive drive pulse timing relative to transmit drive pulse timing, whereby the video pulse signals are expanded time video pulses representing target echoes.

Figure 2:
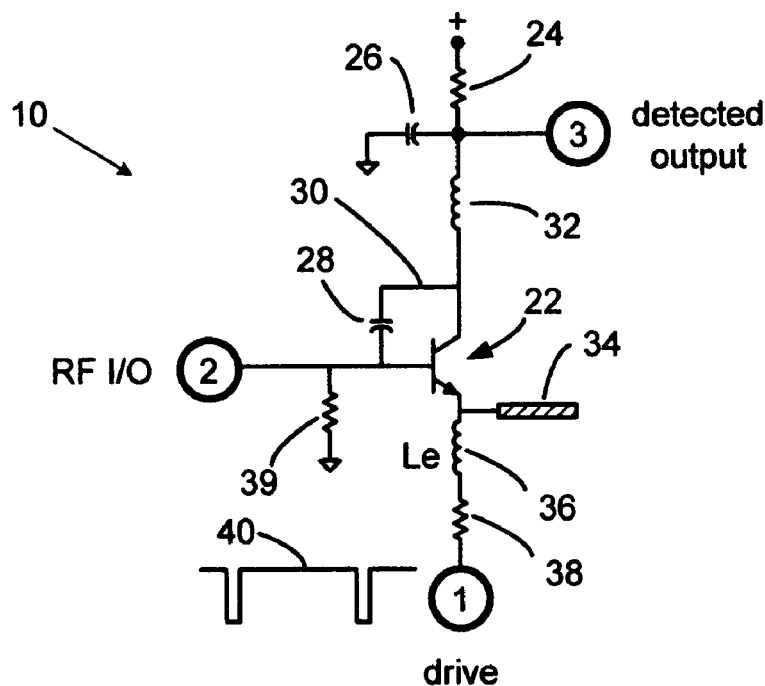
FIG. 2 is a detailed diagram of a self-oscillating emitter-detector.

FIG. 2 is a detailed schematic diagram of the self-oscillating UWB emitter-detector, generally 10. Transistor 22 is the active oscillator and mixer component in the SOM. It is shown as a bipolar transistor having an emitter, a base, and a collector. It could also be a FET having, respectively, a source, a gate, and a drain. In the context of this invention, these respective elements can be considered to be equivalent for the two transistor types. Capacitor 28, parasitic inductance of interconnect 30, inductor $L_e$ and microstrip 34 form a microwave oscillator circuit and all contribute to the resonant frequency of the SOM, in this example. Other oscillator configurations and port configurations are possible. Resistor 38 limits the drive current produced by the negative-going pulses of drive waveform 40. Resistor 39 is a termination resistor, generally 50 ohms, that also provides a DC return for base currents from transistor 22. Capacitor 26 is an integration capacitor and resistor 24 is a bias resistor, which sources a current equal to the average current through transistor 22. Inductor 32, which can be formed by a microstrip element, provides RF isolation between transistor 22 and capacitor 26. Resistor 24 and capacitor 26, in combination with the collector impedance of transistor 22 and any load that is placed on port 3, form the integrators time constant, which is larger than two pulse repetition intervals of waveform 40 so multiple pulse integration can occur. Additional integration, or low-pass filtering, can occur downstream of port 3.

Port 2 couples UWB RF input signals to the base of the transistor. Drive pulses are coupled from port 1 to the emitter of the transistor and drive the transistor into microwave oscillations that are phase-locked to the drive pulses. Transistor 22 mixes the UWB RF input with the self-oscillations and provides amplified mixer output pulses from its collector to integration capacitor 26. Voltages on capacitor 26 arise from coherent, or signed, integration of the mixer output pulses and are output on port 3 as detected output signals. Integration capacitor 26 is generally much larger than microwave oscillator capacitor 28, so capacitor 28 is not considered to be an integration capacitor.

Figure 3A:
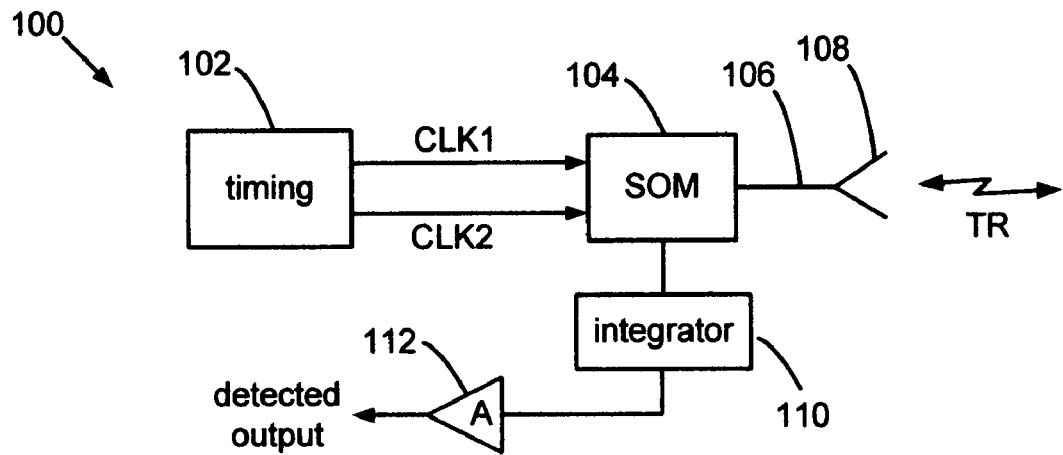
FIG. 3a is a diagram of a homodyne radar including the emitter-detector.

FIG. 3a is a block diagram of a self-oscillating emitter-detector configured as a homodyne radar, generally 100. A homodyne system can employ the same oscillator for generating transmit signals and for generating local oscillator signals for a receive mixer. A timing system 102 produces two clock signals, CLK1 and CLK2 which generally operate at the radar PRF. CLK1 is a transmit clock signal and CLK2 is a receive clock signal, which is generally a delayed signal relative to the transmit clock signal. CLK1 and CLK2 sequentially bias-on SOM 104, which generates UWB RF pulses on line 106 whenever biased-on, with the UWB RF pulses being phase-locked to the clock signals. Line 106 is coupled to transducer 108, and in the case where the transducer is an antenna, a UWB RF pulse is radiated into free space. Radiated pulses that arise from CLK1 can echo back at the exact time that CLK2 biases-on the SOM, producing gated mixer pulses that are coupled to integrator 110. Integrator 110 outputs an integrated signal to amplifier 112, which produces a detected output signal.

The detected output signal can be a Doppler signal resulting from target motion that produces echoes that are time coincident with CLK2 timing, wherein the CLK2 timing has a fixed or adjustable delay relative to the CLK1 timing. This is a form of range gated Doppler. The detected output signal can also be expanded time video pulse signals representing transmit and echo pulses in a radar rangefinder, in which case CLK2 is swept in time relative to CLK1.

Figure 3B:
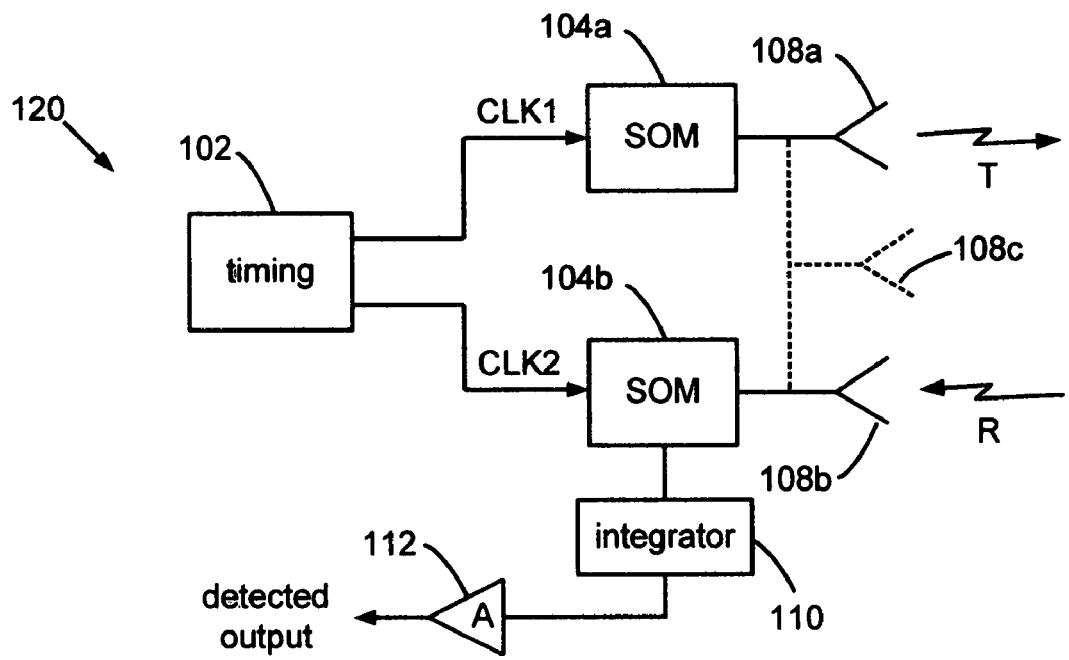
FIG. 3b is a diagram of a heterodyne radar including an emitter-detector.

FIG. 3b is a block diagram of a heterodyne system, generally 120. A heterodyne system can employ two oscillators, or SOMs, one to generate transmit oscillations and one to generate receive local oscillator signals for self-mixing. Timing system 102, integrator 110 and amplifier 112 are as described previously. CLK1 biases-on SOM 104a, similarly to the SOM in reference to FIG. 3a including the phase-locking aspect, and SOM 104a produces a UWB RF pulse for radiation via transducer 108a. Transducer 108b receives echoes from the transmitted pulses and couples them to SOM 104b. CLK2 biases-on SOM 104b, similarly to the SOM in reference to FIG. 3a including the phase-locking aspect. SOM 104b, which oscillates independently from SOM 104a, couples mixer output pulses to integrator 110, pulses that result from mixing action between UWB RF input from transducer 108b and its phase-locked self-oscillations. The detected output signals from integrator 110 can be substantially the same as those from homodyne system 100. The use of separate SOMs 104a and 104b facilitate the use of separate transducers 108a and 108b, which can be advantageous when transducers 108a and 108b are circularly polarized antennas, or with bistatic systems, such as radiolocation systems, or simply to allow for differing transmit and receive bandwidths, RF levels, and antennas. Alternatively, the output from SOM 104a and input to SOM 104b can be combined onto a single transducer 108c using various RF combining techniques known in the art, as indicated by the dashed lines to transducer 108c.

Figure 4:
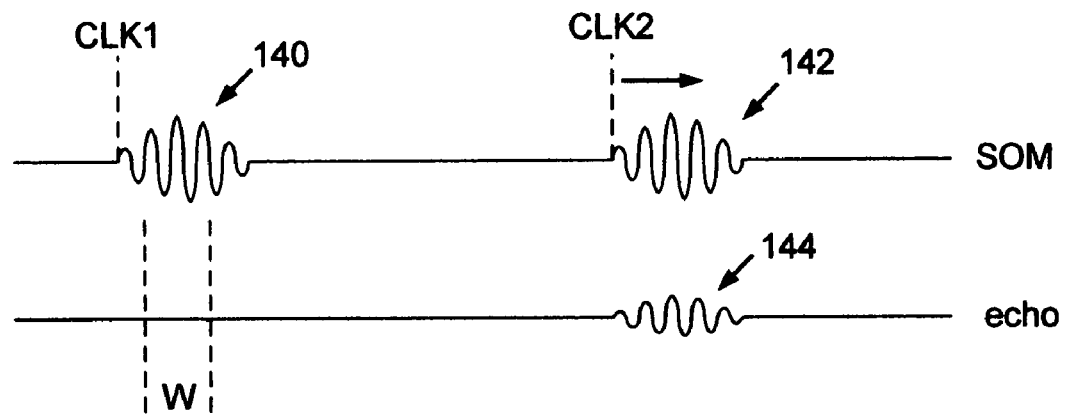
FIG. 4 is a timing diagram of a radar employing an emitter-detector.

FIG. 4 is a timing diagram for radars 100 and 120. The upper trace, labeled SOM, depicts UWB RF pulses as may be produced by SOM 104 on line 106 and are radiated into free space by transducer 108, in the case where transducer 108 is an antenna. A timing point defined by a dashed line labeled CLK1 initiates phase-locked oscillations in the SOM and produces a sinusoidal UWB RF pulse packet 140 generally comprised of a limited number of sinusoids. The specific number of cycles may be dictated by bandwidth limits set by a regulatory agency such as the FCC. For example, about nine cycles at the ½ maximum points W may be needed to comply with FCC Part 15.209 regulations at a center frequency of 6.3 GHz. CLK2 initiates packet 142 from SOM 104 or 104b, which is actually spurious leakage radiation from SOM 104, as these oscillations are intended for a receive function, i.e., for mixing with echo 144. In simple designs, this leakage can be allowed, but it does contribute to the total emission level and can result in having to reduce the transmit level somewhat to comply with regulatory emission limits. An arrow by a dashed line labeled CLK2 indicates optional sweeping of the CLK2 timing relative to the echo, which can produce expanded time echo pulses at the detected output. Since RF bursts 140 and 142 are phase-locked to CLK1 and CLK2, respectively, the relative temporal locations of CLK1 to burst 140, and CLK2 to burst 142 are fixed. Expanded time video signals result from a combination of sweeping CLK2 relative to CLK1 while repetitively sampling echoes. Expanded time techniques are also known as down-mixing or aliasing-down. Time expansion factors in excess of 100,000 are common in precision radar rangefinders. Alternatively, CLK1 can be fixed in time relative to CLK2, or adjustably fixed, so temporal motion of the echo produces a beat frequency, or Doppler, which can only be detected when the echo coincides with packet 142. This is a range gated Doppler mode for radars 100 or 120, where Doppler responses are intentionally limited to a downrange spatial shell. Spatial shells are useful for reducing Doppler clutter from, for example, object motion beyond a selected detection region.

Echo 144, a UWB RF input signal, exhibits phase coherence relative to oscillations 140 and 142. Oscillations 140 and 142 are phase-locked to the clock signals. For coherent integration to occur in integrator 16, the UWB RF input signal must have a coherent phase relation to the clock signals. This is the general case for radar systems since the transmit and receive clocks are often derived from the same timing system. Radio systems must provide for phase stabilizing, i.e., synchronizing between the transmit and receive docks. Random and pseudo-random transmissions can be implemented provided the receive timing accounts for the randomness and maintains phase coherence at the instant of sampling. One example of this is disclosed in U.S. Pat. No. 6,464,705, "Spread Spectrum Radar Clock," by the present inventor.

Figure 5:
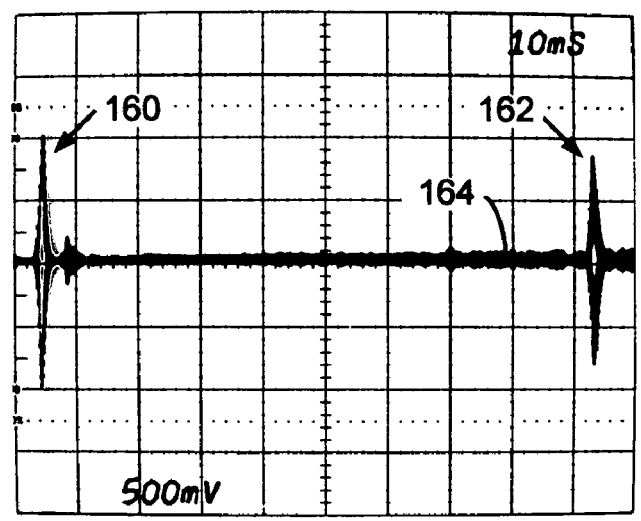
FIG. 5 is a video waveform from a hardware embodiment of the radar of FIG. 3b with nanowatt level emissions.

FIG. 5 is an oscillogram taken from an implementation of radar system 120 operating with 1.5 ns wide pulses centered at 6.3 GHz and an average transmit power of 0.8 nanowatts. The average power is obtained by multiplying the power of burst 140, the pulse power, by the duty cycle, which is often less than 1%. This power level is believed to be, by a wide margin, the lowest transmit power ever used in a radar system. It would take about 1-billion of these radars to add up to the emission level of a some cell phones. Pulse 160 is the detected output resulting from the temporal coincidence of CLK1 and CLK2; it is the transmit pulse. Pulse 162 is an echo pulse from a metal plate 19 meters downrange. Random noise and clutter 164 is about 25 dB below the peak of echo pulse 162. This result cannot be achieved with a conventional UWB sampler or without a very low-noise front end. The self-oscillating UWB emitter-detector in this embodiment, based on a single SiGe transistor, exhibits a 3 dB noise figure. No preamplifier was required and detector power consumption is significantly lower than that of a conventional preamplifier. The antenna gain is 22 dB and the expanded time scale is 10 ms per division with a time expansion factor of 653,000, i.e., realtime events appear 653,000 times slower. Pulses 160 and 162 have realtime pulse widths of about 1.5 ns and are expanded to a millisecond scale.

Figure 6:
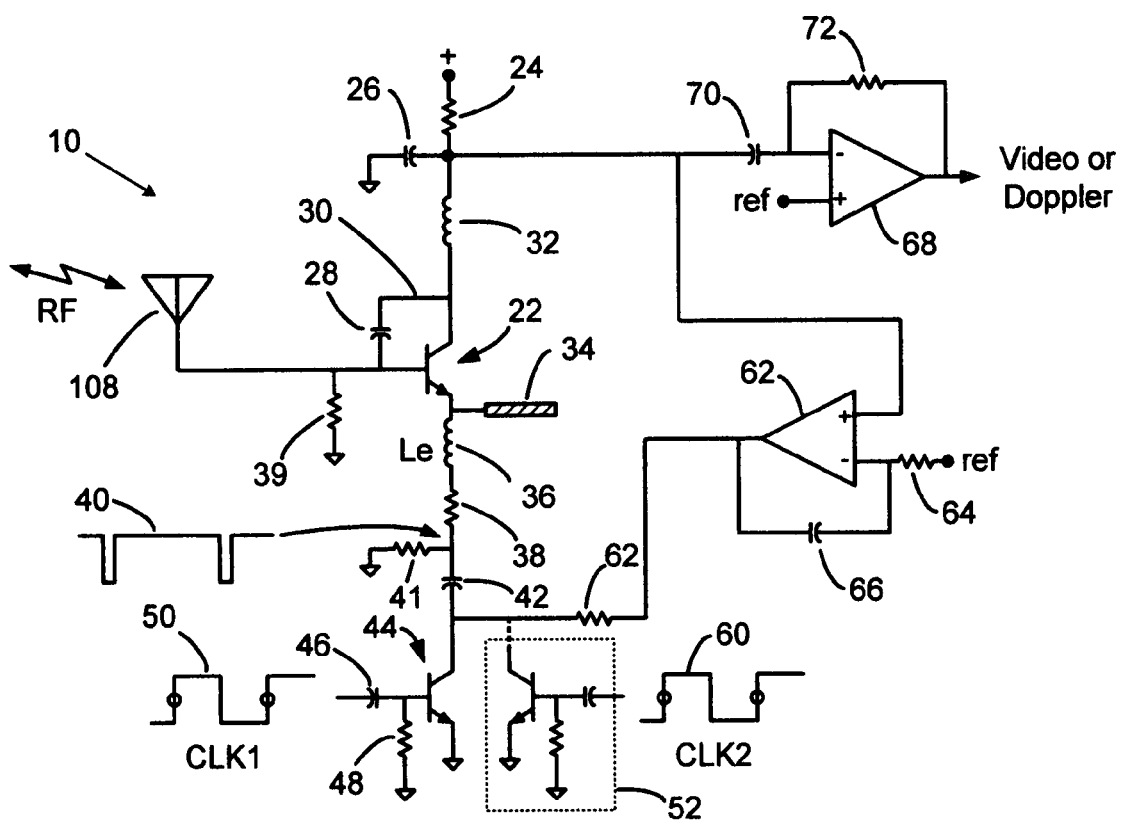
FIG. 6 is a detailed diagram of a self-oscillating emitter-detector including a drive regulator and video amplifier.

FIG. 6 is a detailed schematic diagram of a self-oscillating emitter-detector with a regulator for controlling the amplitude of the RF oscillations of the SOM. Elements 22, 24, 26, 28 30, 32, 34, 36, 38, and 39 are as described with respect to FIG. 2 and comprise the SOM and integrator. Op amp 62 compares collector voltage at one end of resistor 24, which is a measure of average current through SOM transistor 22, to a reference voltage one end of resistor 64. Differences in these voltages are amplified by op amp 62 and applied to the collector bias resistor of drive transistor 44, thereby controlling the drive level and thus the average current through SOM transistor 22. Resistor 64 and capacitor 66 stabilize the control loop. Since the duty cycle of the drive pulses is fixed by waveform 40, the average-to-peak level of drive current ratio is fixed. Thus, by regulating the average current, the peak current in transistor 22 is also regulated. The peak current is closely related to the amplitude of the RF oscillations produced by transistor 22, and so op amp 62 effectively regulates the RF oscillation level. Op amp 68, in combination with gain setting feedback resistor 72 and coupling capacitor 70, form video amp 112 as seen in radars 100 and 120. The +symbol indicates a DC supply voltage, generally about 3V.

The use of a regulator has a most interesting result: microwave RF oscillations can be reliably regulated at an extremely low level, e.g., 5 mV, or about 1-nanowatt average power for 0.2% duty cycle—a not uncommon duty cycle for UWB radar. This is in stark contrast to most RF oscillators that oscillate at a level on the order of a volt, i.e., at their saturated level. These classically high levels are far too high for applications such as nanowatt transmitters needed for meeting stringent regulatory limits. Even if one were to attenuate the common 1-volt oscillation levels, leakages and direct radiation would require expensive shielding, special attenuators and bypassing to meet FCC compliance standards. High oscillation levels, on the order of 1-volt, are common since high junction voltages, transistor $F_t$ variations, temperature, etc., make operation at low oscillation levels unreliable. However, the regulator loop of the present invention makes very low oscillation amplitudes a practical reality, and it is accomplished with minimal cost and complexity.

In the event that both the transmit clock CLK1 and receive dock CLK2 are applied to the same SOM, a second pulse driver, shown within dashed box 52, can be collector OR'd into the circuit to provide UWB transmit and receive clock pulses to the SOM. The components inside box 52 can be the same as elements 44, 46, and 46. Capacitor 46 and resistor 48 can differentiate a square-wave clock signal into a narrow UWB pulse on the order of 1 ns wide, for example. The SOM oscillations will closely follow the width of the drive pulses from transistor 44. Other pulse drivers are known to one skilled in the art. Resistor 41 and capacitor 42 comprise an AC coupled level shifter.

Transistors 22 and 44 (and the optional transistor inside block 52) can be silicon germanium transistors such as a NESG2030's by NEC-CEL, Inc. Op amps 62 and 68 can be TLV-272 by Texas instruments.

Figure 7A:
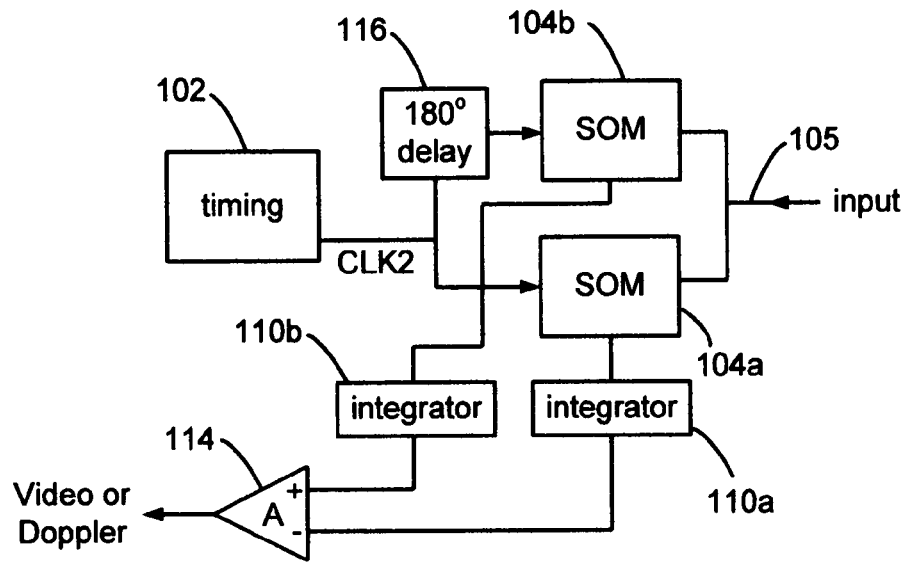
FIG. 7a is a block diagram of a timing-based LO leakage canceling arrangement.

FIG. 7a is a block diagram of a self-oscillating UWB detector having reduced oscillation leakage out the input port; in effect, having reduced local oscillator leakage. A timing signal from timing circuit 102, e.g., CLK2, is directly coupled to a first SOM 104a and coupled though a delay circuit 116 to a second SOM 104b. Microwave oscillations within the SOMs are tightly phase-locked to the CLK2 pulses. Thus, the RF sinusoids from SOM1 and SOM2 that are leaked to input line 105 (or port) are 180° out of phase and cancel. Consequently, leakage radiation out of the input port is substantially reduced (but generally non-zero in practice due to secondary effects). Integrated signals from integrators 110a and 110b are 180° out of phase due to the RF phase difference (phase is transparent through a mixer) and are additively combined in differential video amp 114 to produce a detected output signal, generally in the form of video pulses or Doppler signals.

Figure 7B:
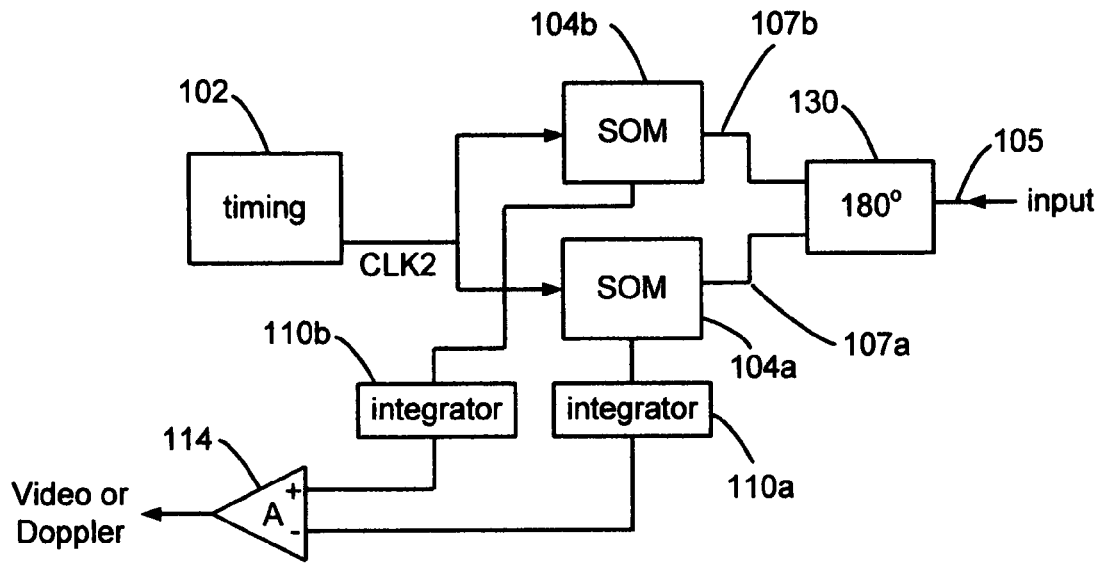
FIG. 7b is a block diagram of a combiner-based LO leakage canceling arrangement.

FIG. 7b is a block diagram of a self-oscillating UWB detector having reduced oscillation leakage out the input port. A common dock signal CLK2 from timing circuit 102 is applied to SOMs 104a and 104b. The inputs of the SOMs are coupled via lines 107a and 107b to a single input line via a 180° coupler 130. Thus, in-phase leakage RF from the SOMs combine in splitter 130 out of phase and cancel, thereby reducing or practically eliminating RF leakage out the input line 105. The SOM leakages are in phase because their drives, both being from CLK2, are in phase. During reception, input signals are shifted 180° and applied to the two SOMs out of phase. The SOM outputs produce signals that are 180° out of phase, which after integration are recombined via differencing video amp 114 to produce a combined detected signal.

The use of the term "ultra-wideband" or the acronym UWB herein refers to not only the classic DARPA definition of a bandwidth of greater than 25% of the center frequency, but also to the FCC definition of greater than 500 MHz bandwidth at the −10 dB main lobe spectral points. It also refers to a common consensus in the UWB community that the earliest use of UWB technology dates back to spark radios circa 1900, which shock-excited antennas into their natural resonance in the low megaHertz region, resulting in radiated bandwidths on the order of 1 MHz. At least one paper dating to circa 1916 specifically discusses a spark-type impulse radio for use in the low HF bands, also indicating a UWB bandwidth on the order of 1 MHz. Accordingly, the historical definition of UWB can be construed as any signal bandwidth of greater than 1 MHz. "UWB" in this disclosure includes all these definitions of UWB and refers to UWB RF signal bandwidths from 1 MHz and up.

The use of the term "transducer" refers to an antenna for coupling electrical signals from a conductor to and from free space or other propagation medium; or it can refer to a time domain, reflectometer (TDR) launcher, such as, for example, described in U.S. Pat. No. 6,452,467, "Material Level Sensor Having a Wire-Horn Launcher," to the present inventor; or it can refer to an optical source such as a laser diode or to an optical detector such as a photodiode, as described in U.S. Pat. No. 5,767,953, "Visible Beam Range Finder," also by the present inventor. In all these cases, the self-oscillating UWB emitter-detector of the present invention can be coupled to any of these transducers by one skilled in the art to utilize the benefits of the invention.

Changes and modifications in the specifically described embodiments can be carried out without departing from the scope of the invention which is intended to be limited only by the scope of the appended claims.

What is claimed is:

1. A method of detecting UWB RF pulses, comprising:
   producing pulsed oscillations in a self-oscillating mixer (SOM) that are phase-locked to a clock signal;
   mixing UWB RF pulses with the pulsed oscillations in the SOM to produce mixer pulses;
   coherently integrating the mixer pulses to produce a detected output signal.

2. A UWB RF pulse detector, comprising:
   a self-oscillating mixer (SOM) having, (1) an input port for coupling UWB RF signals to the SOM, (2) a drive pulse port for coupling drive pulses to the SOM, wherein the drive pulses produce pulsed phase-locked oscillations in the SOM, and (3) a mixer output line for outputting mixer pulses from the SOM, wherein the mixer pulses result from mixing action between the UWB RF signals and the pulsed oscillations; and,
   an integrator coupled to the mixer output line for coherently integrating two or more mixer output pulses and for producing a detected output signal.

3. A UWB RF pulse detector, comprising:
   a transistor for simultaneously providing a pulsed oscillation element and a mixer element;
   a microwave oscillator circuit including the transistor;
   an RF input line coupled to the transistor;
   a drive pulse line coupled to the transistor for driving the transistor into microwave oscillations that are phase-locked to the drive pulses;
   an integrating capacitor coupled to the transistor for coherently integrating mixer pulses from the transistor and for producing a detected output signal.

4. A self-oscillating emitter-detector radar system comprising:
   a timing system for producing a transmit and a receive clock signal;
   a self-oscillating mixer (SOM) responsive to both clock signals and for producing RF oscillations that are phase-locked to each clock signal;
   an antenna coupled to the SOM for transmitting RF pulses produced by the SOM and for receiving UWB RF echoes and for providing UWB RF echo pulses to the SOM; and,
   an integrator coupled to the SOM for coherently integrating mixer pulses from the SOM and for producing a detected output signal.

5. The self-oscillating emitter-detector radar system of claim 4 wherein the timing system provides an adjustable or a fixed delay between the transmit and receive clock signals for producing range-gated Doppler signals from the integrator.

6. The self-oscillating emitter-detector radar system of claim 4 wherein the timing system provides a swept delay between the transmit and receive clock signals for producing video pulse signals from the integrator.

7. A self-oscillating emitter-detector radar system, comprising:
   a timing system for producing a transmit and a receive clock signal;
   a transmit self-oscillating mixer (SOM) SOM responsive to the transmit clock signal for producing RF oscillations that are phase-locked to the transmit clock signal;
   an antenna coupled to the first SOM for transmitting the RF self-oscillations;
   a receive SOM responsive to the receive clock signal for producing mixer RF oscillations that are phase-locked to the receive clock signal;
   an antenna coupled to the second SOM for receiving UWB RF echoes and for providing UWB RF echo pulses to the receive SOM; and,
   an integrator coupled to the second SOM for coherently integrating mixer pulses from the second SOM and for producing a detected output signal.

8. The self-oscillating emitter-detector radar system of claim 7 wherein the timing system provides an adjustable delay or a fixed between the transmit and receive clock signals for producing adjustable range-gated Doppler signals from the video amplifier.

9. The self-oscillating emitter-detector radar system of claim 7 wherein the timing system provides a swept delay between the transmit and receive clock signals for producing video pulse signals from the video amplifier for range-finding.

* * * * *